United States Patent
Ikezawa et al.

(10) Patent No.: US 7,457,129 B2
(45) Date of Patent: Nov. 25, 2008

(54) MULTILAYER PRINTED WIRING BOARD

(75) Inventors: Yoshiyuki Ikezawa, Eniwa (JP); Takeshi Sunada, Eniwa (JP); Tomoyasu Gunji, Eniwa (JP); Katsuhiko Matsuura, Eniwa (JP); Hidetoshi Hiramori, Eniwa (JP); Tetsuya Yasuoka, Eniwa (JP)

(73) Assignee: Clover Electronics Co., Ltd., Eniwa (JP)

( * ) Notice: Subject to any disclaimer, the term of this patent is extended or adjusted under 35 U.S.C. 154(b) by 0 days.

(21) Appl. No.: 11/892,767

(22) Filed: Aug. 27, 2007

(65) Prior Publication Data
US 2008/0049406 A1 Feb. 28, 2008

(30) Foreign Application Priority Data
Aug. 28, 2006 (JP) .............................. 2006-231172
Aug. 20, 2007 (JP) .............................. 2007-213808

(51) Int. Cl.
*H05K 7/00* (2006.01)
(52) U.S. Cl. ...................................... 361/735; 361/760
(58) Field of Classification Search ................. 361/735, 361/752, 790, 797, 761, 760, 736, 741, 679; 174/250–262
See application file for complete search history.

(56) References Cited

U.S. PATENT DOCUMENTS

| | | | | |
|---|---|---|---|---|
| 5,686,702 A | * | 11/1997 | Ishida | ........................ 174/250 |
| 6,324,067 B1 | * | 11/2001 | Nishiyama | ................... 361/761 |
| 2002/0192870 A1 | * | 12/2002 | Ikeda et al. | .................. 438/118 |
| 2006/0021791 A1 | * | 2/2006 | Sunohara et al. | ............ 174/255 |
| 2008/0151520 A1 | * | 6/2008 | Sakamoto et al. | ........... 361/764 |

FOREIGN PATENT DOCUMENTS

JP 2005-39094 A 2/2005

* cited by examiner

*Primary Examiner*—Hung S Bui
(74) *Attorney, Agent, or Firm*—Birch, Stewart, Kolasch & Birch, LLP (57) ABSTRACT

There is provided a multilayer printed wiring board including semiconductor element therewithin, which can realize high density wiring. A multilayer printed wiring board 1 includes a first printed wiring board 10 having a semiconductor element 2 mounted on a wiring pattern 12, a second printed wiring board 21 laminated on the wiring pattern 12 through a first insulating layer 20, a third printed wiring board 31 laminated on the second printed wiring board 21 through a second insulating layer 30, and a space region penetrating through the first insulating layer 20 and the second printed wiring board 21 in the thickness direction and adapted so that the semiconductor element 2 can be accommodated therewithin. The second printed wiring board 21 includes first bumps 26 penetrating through the first insulating layer 20 in the thickness direction, and second bumps 28 penetrating through the insulating layer 27 in the thickness direction, and the bumps 26 and 28 each have a diameter of the maximum bottom surface ranging from 50 μm to 200 μm.

12 Claims, 9 Drawing Sheets

MULTILAYER PRINTED WIRING BOARD

BACKGROUND OF THE INVENTION

1. Field of the Invention

The present invention relates to a multilayer printed wiring board.

2. Description of the Related Art

In recent years, with rapid development of electronic information technology, semiconductor elements are required to have performance more than the conventional performance, and to realize reduction in dimensions and thickness. Followed by this, similar requirements are made for printed wiring boards on which such semiconductor elements are mounted.

Figure 9:
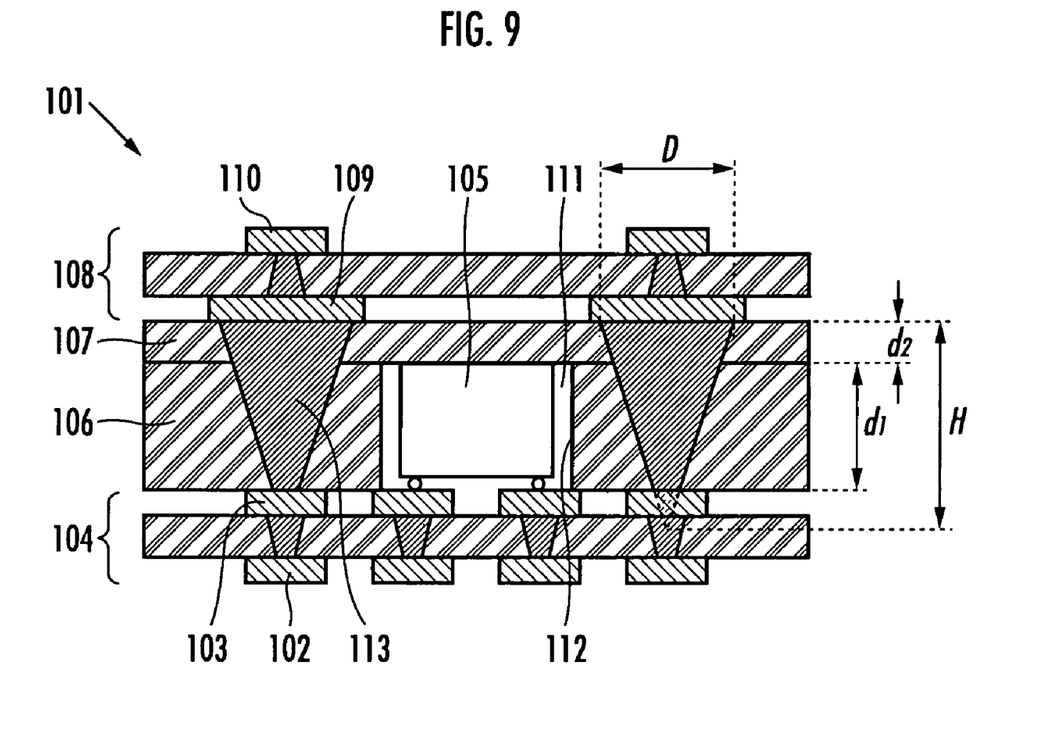
FIG. 9 is an explanatory cross sectional view showing a multilayer printed wiring board of the related art.

However, when the dimensions of the printed wiring board itself are reduced, there exists restriction in the mounting area for mounting, at a high density, semiconductor elements on the surface of the multilayer printed wiring board. In view of the above, in order to solve this problem, there is proposed a multilayer printed wiring board 101 within which a semiconductor element is housed, as shown in FIG. 9 (see Japanese Patent Application Laid-Open Publication No. 2005-39094).

The multilayer printed wiring board 101 includes a first printed wiring board 104 including: a first wiring pattern 102 formed on one side thereof and a second wiring pattern 103 formed on the opposite side thereof, wherein the first and second wiring patterns 102, 103 are electrically conducted to each other; and a semiconductor element 105 included within the multilayer printed wiring board 101 in the state mounted on the second wiring pattern 103.

A first insulating layer 106 is laminated on the second wiring pattern 103, a second insulating layer 107 is laminated on the first insulating layer 106, and a second printed wiring board 108 is laminated on the second insulating layer 107. The second printed wiring board 108 includes a third wiring pattern 109 formed on the surface opposite to the second insulating layer 107, and a fourth wiring pattern 110 formed on the surface opposite to the third wiring pattern 109. The third wiring pattern 109 and the fourth wiring pattern 110 are electrically connected to each other.

In order to form, between the second and third wiring patterns 103 and 109, a space region 111 within which the semiconductor element 105 can be accommodated, the first insulating layer 106 is required to have a thickness $d_1$ larger than that of the semiconductor element 105. As the result of the fact that the first insulating layer 106 includes a first penetration hole 112 penetrated through the inside of the first insulating layer 106 in the thickness direction, and one opening end part of the first penetration hole 112 is closed by the second insulating layer 107, the above-mentioned space region 111 is formed.

On the other hand, the second insulating layer 107 has a predetermined thickness $d_2$, e.g., in order to prevent crosstalk between the semiconductor element 105 and the third wiring pattern 109.

On the third wiring pattern 109, there are formed metallic bumps 113 penetrated through the second insulating layer 107 and the first insulating layer 106 in the thickness direction. The metallic bump 113 allows the third wiring pattern 109 and the second wiring pattern 103 to be electrically conducted to each other.

In the multilayer printed wiring board 101 thus constituted, the semiconductor element 105 is accommodated within the space region 111.

In this case, the metallic bump 113 penetrated through the second insulating layer 107 and the first insulating layer 106 in the thickness direction is formed in a manner as described below.

First, metallic mask having penetration holes at predetermined positions is laminated on the third wiring pattern 109 of the second printed wiring board 108 and a screen-print process of, e.g., silver paste from on the metallic mask to allow all individual materials to have conical shape followed by drying to thereby form metallic bumps 113. At this time, the metallic bump 113 is formed so as to have a height H larger than sum total of the thickness $d_1$ of the first insulating layer 106 and the thickness $d_2$ of the second insulating layer 107.

Next, the second insulating layer 107 having thickness $d_2$ and the first insulating layer 106 having thickness $d_1$ are laminated in order on the third wiring pattern 109 where the metallic bumps 113 are formed. Pressure is applied to the laminated body thus obtained. As a result, the metallic bumps 113 are penetrated through the second insulating layer 107 and the first insulating layer 106 in the thickness direction so that the front end of each metallic bump 113 is exposed from the first insulating layer 106.

Finally, the first printed wiring board 104 is laminated on the first insulating layer 106, from which the front end of each metallic bump 113 is exposed, with the plane surface of the second wiring pattern 103 facing the first insulating layer 106, and is pressure-fitted thereonto. As a result, the first printed wiring board 104 is laminated on the first insulating layer 106. Further, the front end of each metallic bump 113 is collapsed by the second wiring pattern 103. Thus, the third wiring pattern 109 and the second wiring pattern 103 are electrically conducted to each other through the metallic bump 113.

Here, the metallic bump 113 is formed so as to have the following dimensions in order that the metallic bump 113 is penetrated through the second insulating layer 107 and the first insulating layer 106 in the thickness direction. In the case where the thickness $d_1$ of the first insulating layer 106 is, e.g., 120 μm, and the thickness $d_2$ of the second insulating layer 107 is, e.g., 60 μm, the metallic bump 113 is formed so as to take conical shape having height H of, e.g., 400 μm. In this case, the diameter D of the maximum bottom surface is, e.g., 350 μm.

However, when the metallic bump 113 has large diameter D of the maximum bottom surface, e.g., 350 μm, there is an inconvenience such that the metallic bump 113 obstacles high density wiring of the multilayer printed wiring board 101.

SUMMARY OF THE INVENTION

An object of the present invention is to eliminate such an inconvenience to provide a multilayer wiring board including semiconductor element therewithin, which can realize high density wiring.

To attain such an object, a multilayer printed wiring board of the present invention is directed to a multilayer printed wiring board including: a first printed wiring board including at least two wiring patterns of a first wiring pattern formed on one side thereof and a second wiring pattern formed on an opposite side thereof, and such that the first and second wiring patterns are electrically conducted to each other; and a semiconductor element housed within the multilayer printed wiring board in the state mounted on the second wiring pattern, which comprises: a second printed wiring board laminated on the second wiring pattern through a first insulating layer; a third printed wiring board laminated on the second printed wiring board through a second insulating layer; and a space region penetrating through the first insulating layer and the second printed wiring board in a thickness direction, and adapted so that the semiconductor element can be accommodated therewithin, wherein the second printed wiring board includes: a third wiring pattern formed on a plane surface opposite to the first insulating layer; a fourth wiring pattern formed on a plane surface opposite to the second insulating layer; a first bump disposed on the third wiring pattern and penetrating through the first insulating layer in the thickness direction; at least one insulating layer disposed between the third and fourth wiring patterns; and a second bump penetrating through the insulating layer in the thickness direction, the third wiring pattern and the second wiring pattern being electrically conducted to each other through the first bump, and the third wiring pattern and the fourth wiring pattern being electrically conducted to each other through the second bump, wherein the third printed wiring board includes: a fifth wiring pattern formed on a plane surface opposite to the second insulating layer; a sixth wiring pattern formed on a plane surface opposite to the last-mentioned plane surface; a third bump disposed on the fifth wiring pattern and penetrating through the second insulating layer in the thickness direction; and a fourth bump penetrated through the inside of the third printed wiring board in the thickness direction, the fifth wiring pattern and the fourth wiring pattern being electrically conducted to each other through the third bump, the fifth wiring pattern and the sixth wiring pattern being electrically conducted to each other through the fourth bump, the first insulating layer and the insulating layer disposed between the third wiring pattern and the fourth wiring pattern each having a thickness ranging from 10 μm to 100 μm, and the first bump and the second bump each having a diameter of the maximum bottom surface ranging from 50 μm to 200 μm.

In the multilayer printed wiring board of the present invention, the semiconductor element housed therewithin is mounted on the second wiring pattern, and is interposed between the first printed wiring board and the third printed wiring board. In order to provide the space region for accommodating the semiconductor element therewithin between the first printed wiring board and the third printed wiring board, the multilayer printed wiring board includes the first insulating layer and the second printed wiring board. The space region is disposed in a manner penetrated through the first insulating layer and the second printed wiring board in the thickness direction, and has a height corresponding to sum total of thicknesses of the first insulating layer and the second printed wiring board. The space region is adapted so that the semiconductor element can be accommodated therewithin.

Here, the thickness of the first insulating layer and the thickness of the insulating layer disposed between the third wiring pattern and the fourth wiring pattern are within the range from 10 μm to 100 μm. Accordingly, the first and second bumps have a diameter of the maximum bottom surface ranging from 50 μm to 200 μm. Thus, those bumps can be penetrated through the respective insulating layers. Moreover, the first and second bumps have a diameter of the maximum bottom surface ranging from 50 μm to 200 μm. Thus, the spacing between a line connected to the first or second bump and another line disposed in a manner adjacent to the line can be narrowed. Accordingly, it is possible to realize high density wiring in the multilayer printed wiring board.

In the case where the thicknesses of the first insulating layer and the insulating layer disposed between the third and fourth wiring patterns are less than 10 μm, withstand voltage across wiring patterns formed on both surfaces of the respective insulating layers becomes insufficient so that the wiring patterns may be electrically conducted to each other. Moreover, in the case where the thickness of the first insulating layer and the thickness of the insulating layer disposed between the third and fourth wiring patterns are above 100 μm, it is necessary to increase the heights of the first and second bumps penetrated through the respective insulating layers. Followed by this, diameters of the maximum bottom surfaces of the first and second bumps become large. Accordingly, realization of high density wiring in the multilayer printed wiring board becomes impossible.

Further, in the case where sizes of the maximum bottom surfaces of the first and second bumps are less than 50 μm, it is impossible to form a bump penetrated through the first or second insulating layer and permitting wiring patterns formed on the both surfaces of the respective insulating layers to be electrically conducted. Moreover, in the case where sizes of the maximum bottom surfaces of the first and second bumps are above 200 μm, high density wiring in the multilayer printed wiring board cannot be realized.

Meanwhile, in the multilayer printed wiring board of the present invention, the second printed wiring board may include a plurality of the insulating layers disposed between the third and fourth wiring patterns, and may include a wiring pattern disposed between the insulating layers. Namely, in the second printed wiring board, one wiring pattern or more may be disposed between the third and fourth wiring patterns, and the respective wiring patterns adjacent to each other may be electrically conducted to each other by the second bumps penetrated through the insulating layer disposed between the both wiring patterns in the thickness direction.

In the case of the latter, third and fourth wiring patterns are electrically conducted through wiring patterns disposed between the third and fourth wiring patterns and plural second bumps which allow the respective wiring patterns adjacent to each other to be electrically conducted. In this case, the number of the wiring patterns disposed between the third and fourth wiring patterns, and the number of the insulating layers disposed between the third wiring pattern and the fourth wiring pattern are increased so that the thickness of the second printed wiring board becomes large, thereby making it possible to increase height of the space region. Thus, it is possible to accommodate, within the space region, a semiconductor element having large thickness. In addition, the number of wiring patterns disposed between the third and fourth wiring patterns is increased, thereby making it possible to increase degree of freedom of wiring.

DETAILED DESCRIPTION OF THE PREFERRED EMBODIMENTS

Embodiments of the present invention will now be described in more detail with reference to the attached drawings. First, a multilayer printed wiring board 1 of this embodiment will be described with reference to FIG. 1.

The multilayer printed wiring board 1 includes a first printed wiring board 10, a semiconductor element 2 housed within the first printed wiring board 10 in the state mounted on the first printed wiring board 10, a second printed wiring board 21 laminated on the first printed wiring board 10 through a first insulating layer 20, a third printed wiring board 31 laminated on the second printed wiring board 21 through a second insulating layer 30, and a space region (part encompassed by single dotted lines in FIG. 1) 3 penetrating through the first insulating layers 20 and the second printed wiring board 21 in a thickness direction and adapted so that the semiconductor element 2 can be accommodated therewithin.

Figure 1:
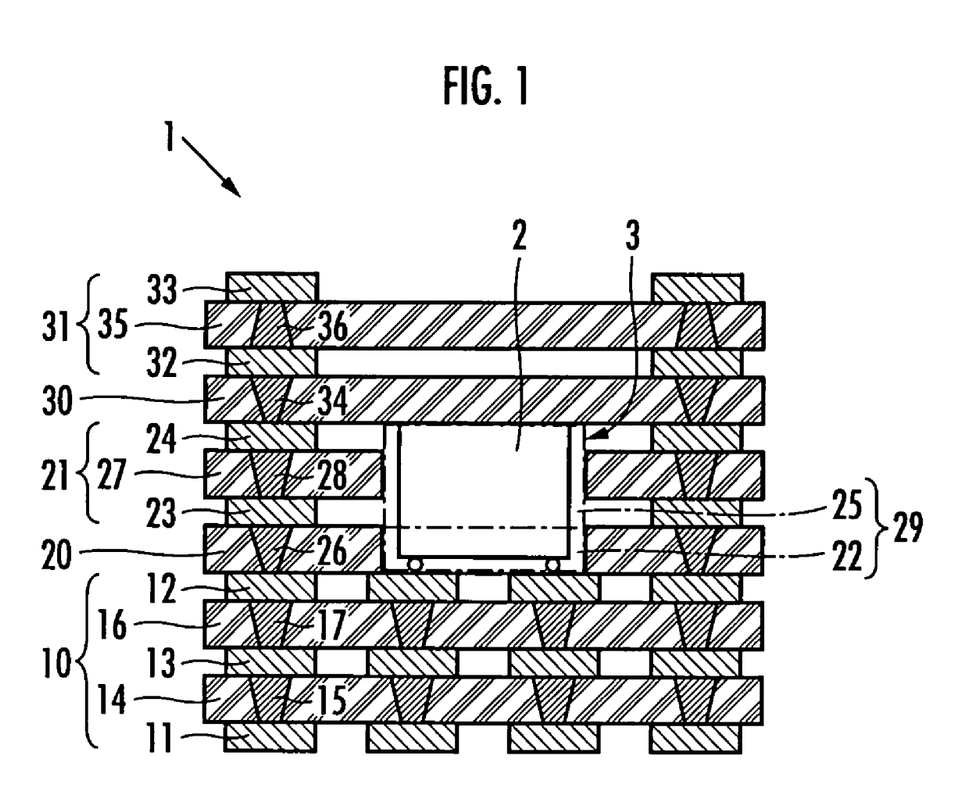
FIG. 1 is an explanatory cross sectional view showing one configuration example of a multilayer printed wiring board housing semiconductor element therewithin of this embodiment.

The first printed wiring board 10 includes a first wiring pattern 11 on one side thereof and includes a second wiring pattern 12 on the opposite side thereof; and further includes a wiring pattern 13 of one layer between the first and second wiring patterns 11 and 12.

The wiring patterns 11, 13 include a first prepreg layer 14 between the both wiring patterns 11, 13, and are electrically conducted to each other through a first silver bump 15 made from silver paste penetrating through the first prepreg layer 14 in a thickness direction. On the other hand, the wiring patterns 13, 12 include a second prepreg layer 16 between the both wiring patterns 13 and 12, and are electrically conducted to each other through a second silver bump 17 penetrating through the second prepreg layer 16 in the thickness direction. Accordingly, the wiring patterns 11, 12 are electrically conducted to each other through the first silver bump 15, the wiring pattern 13 and the second silver bump 17.

The semiconductor element 2 is mounted on the second wiring pattern 12, and the second printed wiring board 21 is laminated through a third prepreg layer 20 as a first insulating layer. In order to provide, between the first printed wiring board 10 and the third printed wiring board 31, the space region 3 within which the semiconductor element 2 can be accommodated, the third prepreg layer 20 and the second printed wiring board 21 have thickness corresponding to the thickness of the semiconductor element 2.

The third prepreg layer 20 includes a first penetration hole (region encompassed by single dotted lines in FIG. 1) 22 penetrating through the inside thereof in the thickness direction and having an opening end part larger than cross sectional shape in the thickness direction of the semiconductor element 2 at a position facing to the semiconductor element 2.

The second printed wiring board 21 includes a third wiring pattern 23 formed on the plane surface opposite to the third prepreg layer 20, and a fourth wiring pattern 24 formed on the plane surface opposite to the second insulating layer 30.

On the third wiring pattern 23, there are formed third silver bumps 26 penetrating through the third prepreg layer 20 in the thickness direction and allowing the wiring patterns 23, 12 to be electrically conducted to each other. In order for the third silver bump 26 to penetrate through the third prepreg layer 20 having, e.g., thickness of 60 μm, the third silver bump 26 is formed to have diameter of the maximum bottom surface of, e.g., 150 μm.

A fourth prepreg layer 27 is disposed between both wiring patterns 23, 24. The wiring patterns 23, 24 are electrically conducted to each other through fourth silver bumps 28 penetrated through the fourth prepreg layer 27 in the thickness direction. In order for the fourth silver bump 28 to penetrate through the fourth prepreg layer 27 having thickness of, e.g., 60 μm, the fourth silver bump 28 is formed so that diameter of the maximum bottom surface is, e.g., 150 μm.

Further, the second printed wiring board 21 includes a second penetration hole (region encompassed by single dotted lines in FIG. 1) 25 penetrating through the inside thereof in a thickness direction, and communicating with the first penetration hole 22. The second penetration hole 25 communicates with the first penetration hole 22 to thereby form a third penetration hole 29 penetrating through the third prepreg layer 20 and the second printed wiring board 21 in the thickness direction. One opening end part of the third penetration hole 29 faces the semiconductor element 2.

On the fourth wiring pattern 24, there is laminated a third printed wiring board 31 through a fifth prepreg layer 30 as a second insulating layer. The fifth prepreg layer 30 is provided for preventing crosstalk between the semiconductor element 2 and the third printed wiring board 31.

The third printed wiring board 31 includes a fifth wiring pattern 32 formed on the plane surface opposite to the fifth prepreg layer 30, and a six wiring pattern 33 formed on the opposite surface thereof.

On the fifth wiring pattern 32, there are formed fifth silver bumps 34 penetrating through the fifth prepreg layer 30 in the thickness direction and allowing the wiring patterns 32, 24 to be electrically conducted to each other.

A sixth prepreg layer 35 is disposed between the both wiring patterns 32, 33. The wiring patterns 32, 33 are electrically conducted to each other through the sixth silver bump 36 penetrating through the sixth prepreg layer 35 in the thickness direction.

As the result of the fact that the other opening end part of the third penetration hole 29 formed in a manner communicating with the first penetration hole 22 and the second penetration hole 25 is closed by the fifth prepreg layer 30, the space region 3 is formed. Namely, the side surface of the space region 3 is formed by the first penetration hole 22 penetrating through the third prepreg layer 20 in the thickness direction, and second penetration hole 25 penetrating through the second printed wiring board 21 in the thickness direction and communicating with the first penetration hole 22, and the top face of the space region 3 is formed by the fifth prepreg layer 30. Further, the semiconductor element 2 mounted on the second wiring pattern 13 is accommodated within the space region 3.

It is to be noted that while sliver bumps 15, 17, 26, 28, 34 and 36 are used as bump in this embodiment, e.g., bump made of conductive paste containing other conductive powder except for silver may be used in place of silver bump made of silver paste.

Moreover, while prepreg layer containing epoxy resin is used as prepreg layer in this embodiment, there may be used prepreg layer containing one or two kinds of resins selected from the group consisting of bismaleimide triazine resin, polyimide resin, polyether resin, phenol resin, polyetheretherketone resin and liquid crystal polymer.

In the multilayer printed wiring board 1 of this embodiment thus constituted, the previously described third and fourth silver bumps 26 and 28 both have diameter of the maximum bottom surface of 150 µm. Accordingly, in the multilayer printed wiring board 1 of this embodiment, the spacing between a line connected to the third silver bump 26 or the fourth silver bump 28 and other line disposed in a manner adjacent to the line can be narrowed. As a result, high density wiring can be realized.

The multilayer printed wiring board 1 of this embodiment shown in FIG. 1 can be manufactured in a manner as described below, for example.

Figure 2:
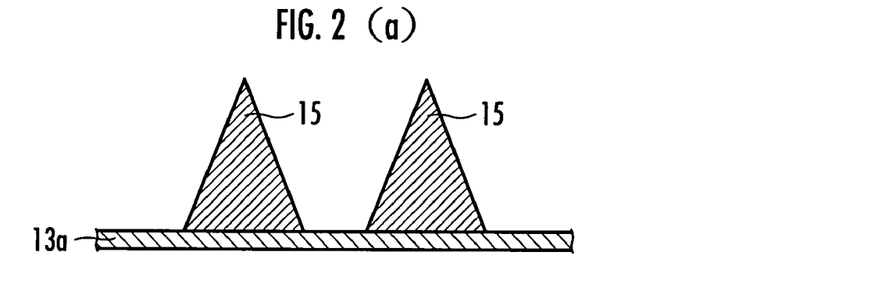
FIG. 2 is an explanatory cross sectional view showing a manufacturing process for the multilayer printed circuit board of the embodiment shown in FIG. 1.

First, as shown in FIG. 2(a), plural first silver bumps 15 are formed at predetermined positions on a conductive support 13a made of metallic foil having thickness of, e.g., 18 µm. The first silver bump 15 is formed by laminating, on a conductive support 13a, for example, metallic mask (not shown) including penetration holes at predetermined positions by screen-printing silver paste on the metallic mask, molding individual conductive pastes which have been pressed into the penetration hole by the screen-print process so that they have conical shapem and drying them. The first silver bump 15 is formed so as to have conical shape of dimensions such that, e.g., diameter of the part in contact with the conductive support 13a is 150 µm and its height is 200 µm.

Next, as shown in FIG. 2(b), first prepreg layer 14 having thickness of, e.g., 60 µm is laminated on the conductive support 13a where the first silver bumps 15 are formed. Pressure is applied to the first prepreg layer 14 thus obtained. By such pressure application, the first silver bumps 15 penetrates through the first prepreg layer 14 in the thickness direction thereof, and the front end of the first silver bump 15 is exposed from the first prepreg layer 14.

Next, as shown in FIG. 2(c), another conductive support 11a made of metallic foil having thickness of, e.g., 18 µm is laminated on the first prepreg layer 14 from which the first silver bump 15 is exposed. The conductive support 11a is pressure-fitted onto the first prepreg layer 14. By another conductive support 11a, the front end of each first silver bump 15 is collapsed. Thus, another conductive support 11a is laminated on the obverse surface of the first prepreg layer 14, and the conductive support 13a of the reverse surface of the first prepreg layer 14 and another conductive support 11a of the obverse surface are electrically conducted.

Next, as shown in FIG. 2(d), etching is implemented to the conductive supports 11a, 13a by the conventional known process so that first wiring pattern 11 is formed on the obverse surface of the first prepreg layer 14, and wiring pattern 13 is formed on the reverse surface.

Figure 3:
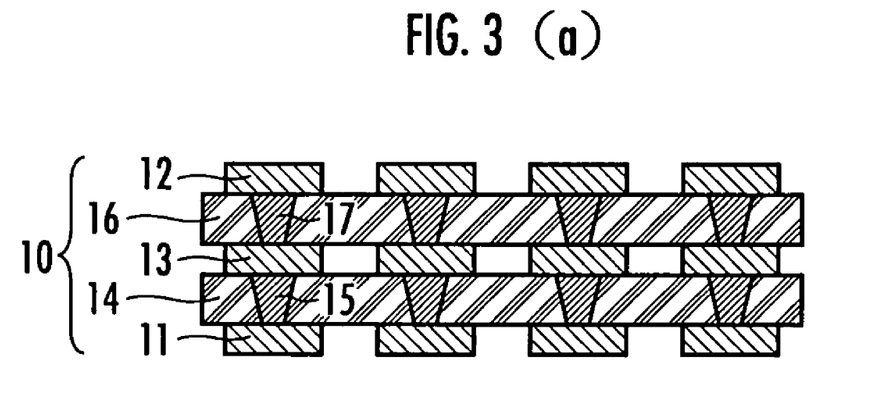
FIG. 3 is an explanatory cross sectional view showing a manufacturing process for the multilayer printed wiring board of the embodiment shown in FIG. 1.

Next, first printed wiring board 10 shown in FIG. 3(a) is formed. First, in accordance with the same procedure as that of FIG. 2(a), plural second silver bumps 17 are formed at predetermined positions on the conductive support 12 (illustrated as second wiring pattern 12) made of metallic film having thickness of, e.g., 18 µm. The second silver bump 17 is formed so as to have dimensions in which, e.g., the diameter of the part in contact with the wiring pattern 13 is 150 µm, and its height is 200 µm. Next, in accordance with the procedure similar to that of FIG. 2(b), second prepreg layer 16 having thickness of, e.g., 60 µm is laminated on the conductive support 12 where the second silver bumps 17 are formed. Pressure is applied to the second prepreg layer 16 thus obtained. By such pressure application, the second silver bump 17 penetrates through the second prepreg layer 16 in the thickness direction, and the front end of the second silver bump 17 is exposed from the second prepreg layer 16. Next, the previously described first prepreg layer 14 is laminated on the second prepreg layer 16, from which the second silver bump 17 is exposed, with the plane surface of the wiring pattern 13 side facing the second prepreg layer 16. Finally, etching is implemented to the conductive support 12 by the conventional known process so that the second wiring pattern 12 is formed. As stated above, the first printed wiring board 10 shown in FIG. 3(a) is formed.

Next, as shown in FIG. 3(b), the semiconductor element 2 is mounted onto the second wiring pattern 12 by performing, e.g., soldering.

Figure 4:
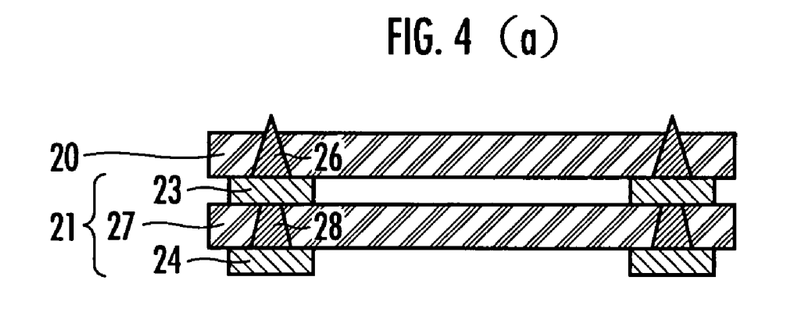
FIG. 4 is an explanatory cross sectional view showing a manufacturing process for the multilayer printed wiring board of the embodiment shown in FIG. 1.

Next, as shown in FIG. 4(a), the second printed wiring board 21 is formed, and third prepreg layer 20 is laminated on the second printed wiring board 21.

First, in accordance with the procedure similar to that of FIG. 2(a), plural fourth silver bumps 28 are formed at predetermined positions on conductive support 24 (illustrated as fourth wiring pattern 24) made of metallic foil having thickness of, e.g., 18 µm. The fourth silver bump 28 is formed so as to take conical shape of dimensions in which, e.g., the diameter of the part in contact with the conductive support 24 is 150 µm and its height is 200 µm. Next, in accordance with the procedure similar to that of FIG. 2(b), a fourth prepreg layer 27 having thickness of, e.g., 60 µm is laminated on the conductive support 24 where the fourth silver bumps 28 are formed. Pressure is applied to the fourth prepreg layer 27 thus obtained. By such pressure application, the fourth silver bump 28 penetrates through the fourth prepreg layer 27 in the thickness direction thereof, and the front end of the fourth silver bump 28 is exposed from the fourth prepreg layer 27. Next, in accordance with the procedure similar to that shown in FIG. 2(c), other conductive support 23 (illustrated as third wiring pattern 23) made of metallic foil having thickness of, e.g., 18 µm is laminated on the fourth prepreg layer 27 from which the fourth silver bump 28 is exposed, and is pressure-fitted thereonto. In accordance with such pressure-fitting, the front end of the fourth silver bump 28 is collapsed by other conductive support 23. As a result, other conductive support 23 is laminated on the surface of the fourth prepreg layer 27, and the conductive support 24 of the reverse surface of the fourth prepreg layer 27 and other conductive support 23 of the obverse surface are electrically conducted through the fourth silver bumps 28. Next, in accordance with the procedure similar to that of FIG. 2(d), etching is implemented to the conductive supports 23, 24 by the conventional known process so that third wiring pattern 23 is formed on the obverse surface of the fourth prepreg layer 27 and the fourth wiring pattern 24 is formed on the reverse surface. By performing above-mentioned process steps, the second printed wiring board 21 is formed.

Next, in accordance with the procedure similar to that of FIG. 2(a), plural third silver bumps 26 are formed on the third wiring pattern 23. The third silver bump 26 is formed so as to take conical shape of dimensions in which, e.g., the diameter of the part in contact with the third wiring pattern 23 is 150 µm, and its height is 200 µm. Next, in accordance with the procedure similar to that of FIG. 2(b), third prepreg layer 20 having thickness of, e.g., 60 µm is laminated on the previously described third wiring pattern 23. Pressure is applied to the third prepreg layer 20 thus obtained. By such pressure application, the third silver bump 26 penetrates through the third prepreg layer 20 in the thickness direction thereof, and the front ends of the third silver bumps 26 are exposed from the third prepreg layer 20. By performing above-mentioned process steps, third prepreg layer 20 is laminated on the third wiring pattern 23 of the second printed wiring board 21 shown in FIG. 4(a).

Next, as shown in FIG. 4(b), the third prepreg layer 20 and the second printed wiring board 21 are punched by, e.g., punch to form a first penetration hole 22 penetrating through the third prepreg layer 20 in the thickness direction thereof, and a third penetration hole 29 penetrating through the second printed wiring board 21 in the thickness direction thereof. The penetration holes 22, 25 are located at a position facing the semiconductor element 2 when the third prepreg layer 20 is laminated on the second wiring pattern 12 which will be described later, and have dimensions having a clearance around the semiconductor element 2 when the semiconductor element 2 is accommodated within the third penetration hole 29 formed by communicating the penetration holes 22, 25 with each other. By performing the above-mentioned process steps, there is formed third penetration hole 29 penetrating through the third prepreg layer 20 and the second printed wiring board 21 in the thickness direction thereof.

Next, as shown in FIG. 4(c), third printed wiring board 31 is formed, and fifth prepreg layer 30 is laminated on the third printed wiring board 31.

The third printed wiring board 31 is formed in accordance with the procedure similar to that when the second printed wiring board 21 is formed. First, plural sixth silver bumps 36 are formed on the conductive support 32 (illustrated as the fifth wiring pattern 32), and the sixth prepreg layer 35 is laminated. Pressure is applied to the sixth prepreg layer 35 thus obtained. By such pressure application, the sixth silver bumps 36 penetrates through the sixth prepreg layer 35 in the thickness direction thereof, and the front end of each sixth silver bump 36 is exposed from the sixth prepreg layer 35. Next, other conductive support 33 (illustrated as the sixth wiring pattern 33) is laminated on the previously described sixth prepreg layer 35, and is pressure-fitted thereonto. By such pressure fitting, the front end of each sixth silver bump 36 is collapsed by other conductive support 33. Thus, other conductive support 33 is laminated on the obverse surface of the sixth prepreg layer 35, and the conductive support 32 of the reverse surface of the sixth prepreg layer 35 and the other conductive support 33 of the obverse surface are electrically conducted through the sixth silver bumps 36. Next, etching is implemented to the conductive supports 32, 33 by the conventional known process so that the sixth wiring pattern 33 is formed on the obverse surface of the sixth prepreg layer 35, and the fifth wiring pattern 32 is formed on the reverse surface. By the above-mentioned process steps, the third printed wiring board 31 is formed.

Next, in accordance with the procedure similar to that when the third prepreg layer 20 is laminated on the second printed wiring board 21, fifth prepreg layer 30 is laminated on the third printed wiring board 31. Namely, plural fifth silver bumps 34 are formed on the fifth wiring pattern 32, and the fifth prepreg layer 30 is laminated. Pressure is applied to the prepreg layer 30 thus obtained. By such pressure application, the fifth silver bumps 34 penetrates through the fifth prepreg layer 30 in the thickness direction thereof, and the front ends of the fifth silver bumps 34 are exposed from the fifth prepreg layer 30.

Figure 5:
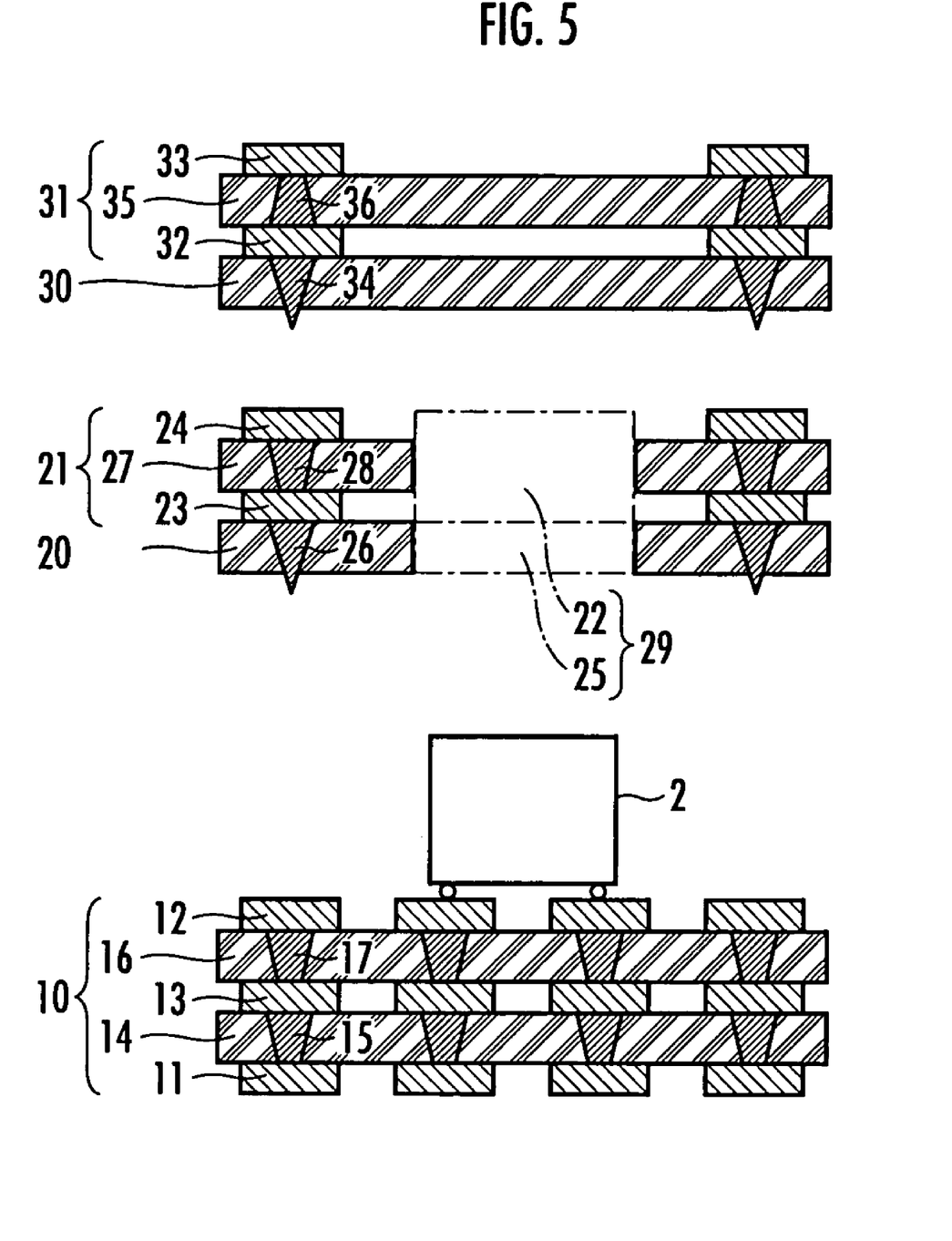
FIG. 5 is an explanatory cross sectional view showing a manufacturing process for the multilayer printed wiring board of the embodiment shown in FIG. 1.

Next, as shown in FIG. 5, second printed wiring board 21 is laminated on the second wiring pattern 12 of the first printed wiring board 10 with the plane surface of the third prepreg layer 20 side facing thereto, and third printed wiring board 31 is laminated on the fourth wiring pattern 24 of the second printed wiring board 21 with the plane surface of the fifth prepreg layer 30 side facing thereto. The members thus obtained are pressed. As a result, as shown in FIG. 1, the front ends of the third silver bumps 26 are collapsed. Thus, the second wiring pattern 12 is laminated on the third prepreg layer 20, and the wiring patterns 23 and 12 are electrically conducted to each other through the third silver bumps 26. Moreover, the front ends of the fifth silver bumps 34 are collapsed. Thus, the fourth wiring pattern 24 is laminated on the fifth prepreg layer 30, and the wiring patterns 32, 24 are electrically conducted to each other through the fifth silver bumps 34. Further, as the result of the fact that the other opening part of the third penetration hole 29 penetrating through the third prepreg layer 20 and the second printed wiring board 21 in the thickness direction thereof is closed by the fifth prepreg layer 30, space region 3 is formed. In addition, semiconductor element 2 mounted on the second wiring pattern 12 is accommodated within the space region 3.

By performing the above-mentioned process steps, the first, second and third printed wiring boards 10, 21 and 31 are integrally connected, and the semiconductor element 2 is accommodated within the space region 3. Thus, multilayer printed wiring board 1 having semiconductor element housed therewithin is manufactured.

It is to be noted that while conductive supports 11a, 12a, 13a, 23a and 24a are made of metallic foil in the multilayer printed wiring board 1 of this embodiment, it is preferable that copper foil is used as metallic foil. Moreover, while the third penetration hole 29 penetrating through the third prepreg layer 20 and the second printed wiring board 21 in the thickness direction thereof is formed by punching with punch, the third penetration hole 29 may be formed by boring with drill, or may be formed by cutting by cutter.

Moreover, while the multilayer printed wiring board 1 of this embodiment is seven layer board, there may be employed a multilayer printed wiring board of 14 layer boards within which two semiconductor elements 2 are mounted. Such piece size multilayer printed wiring board is manufactured in a manner as described below. First, plural silver bumps (not shown) are formed on the sixth wiring pattern 33 of one multilayer printed wiring board 1. Next, prepreg layer (not shown) is laminated on the sixth wiring pattern 33 where the silver bumps are formed. Pressure is applied to the sixth wiring pattern 33. By such pressure application, the silver bumps penetrates through the prepreg layer in the thickness direction thereof, and the front ends of the silver bumps are exposed from the prepreg layer. Next, one multilayer printed wiring board 1 where the prepreg layer is laminated on the sixth wiring pattern 33 is laminated on first wiring pattern 11 of other multilayer printed wiring board 1 from the prepreg layer side, and is pressure-fitted thereonto. The front ends of the silver bumps are collapsed by the first wiring pattern 11 of the other multilayer printed wiring board 1. Thus, the first wiring pattern 11 of the other multilayer printed wiring board 1 is laminated on the surface of the prepreg layer. Further, the sixth wiring pattern 33 of one multilayer printed wiring board 1 and the first wiring pattern 11 of the other multilayer printed wiring board 1 are electrically conducted to each other through the silver bumps. While explanation has been given here in connection with the multilayer printed wiring board in which two multilayer printed wiring boards 1 within which semiconductor element 2 is mounted are laminated in a vertical direction, three or more multilayer printed wiring boards may be laminated similarly to the above.

Figure 6:
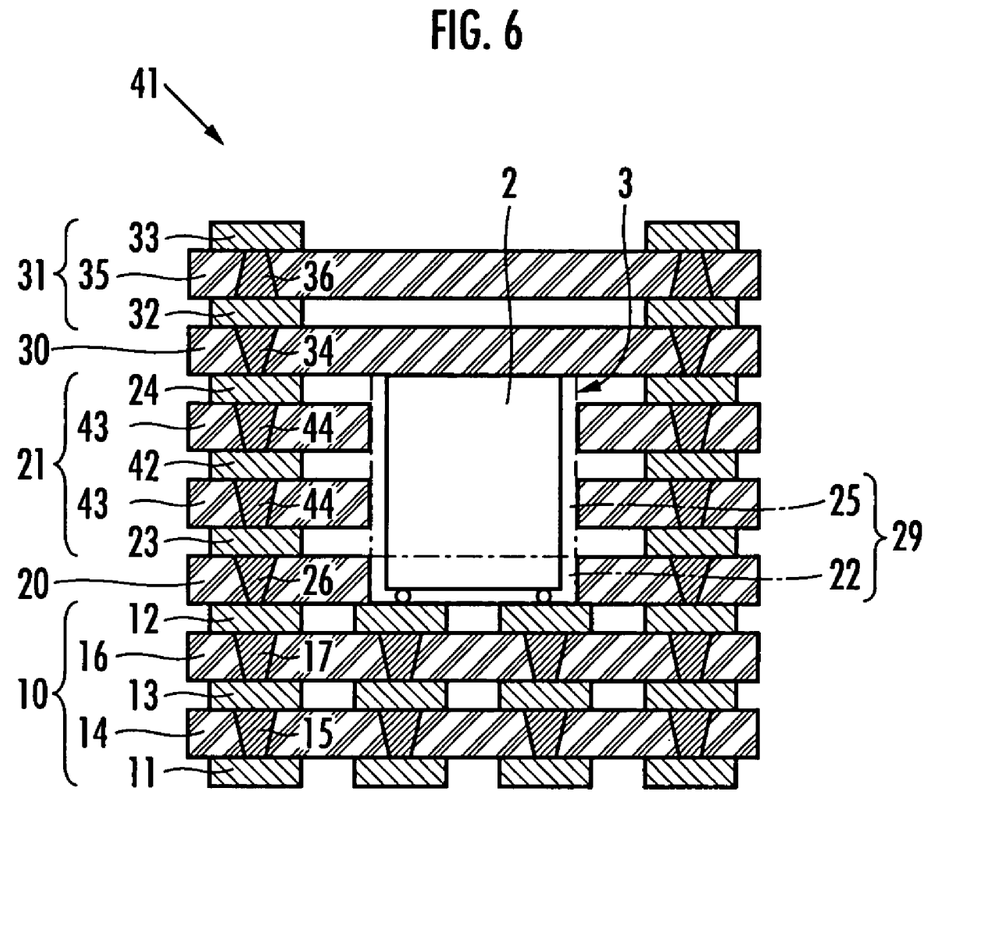
FIG. 6 is an explanatory cross sectional view showing another configuration example of a multilayer printed wiring board housing semiconductor element therewithin of the embodiment.

Further, the multilayer printed wiring board of the present invention may be caused to be of configuration further including one wiring pattern layer or more between the third and fourth wiring patterns 23 and 24 as in the case of a multilayer printed wiring board 41 shown in FIG. 6. Thus, the multilayer printed wiring board 41 can accommodate a semiconductor element 2 having a larger thickness within the space region 3.

The multilayer printed wiring board 41 of this embodiment will be explained with reference to FIG. 6. The multilayer wiring board 41 has the same configuration as the configuration of the multilayer printed wiring board shown 1 in FIG. 1 except for the configuration of the second printed wiring board 21.

In the multilayer printed wiring board 41, the second printed wiring board 21 includes a wiring pattern 42 between third and fourth wiring patterns 23 and 24. The wiring patterns 23, 42 include one prepreg layer 43 between the both wiring patterns 23 and 42, and are electrically conducted to each other through one silver bumps 44 penetrated through one prepreg layer 43 in the thickness direction thereof. Moreover, the wiring patterns 42 and 24 includes other prepreg layer 43 between both wiring patterns 42, 24, and are electrically conducted to each other through other silver bumps 44 penetrated through the other prepreg layer 43 in the thickness direction thereof.

In this case, the prepreg layer 43 and silver bump 44 of the multilayer printed wiring board 41 correspond to the fourth prepreg layer 27 and the fourth silver bump 28 of the multilayer printed wiring board 1, respectively.

In the multilayer printed wiring board 41 of the embodiment, the number of wiring patterns 42 disposed between the third and fourth wiring patterns 23 and 24, and the number of prepreg layers 43 disposed between the third wiring pattern 23 and the fourth wiring pattern 24 are increased to increase the thickness of the second printed wiring board 21, thereby making it possible to increase the height of the space region 3. Accordingly, in the multilayer printed wiring board 41 of the embodiment thus featured, it is possible to accommodate a semiconductor element 2 having large thickness within the space region 3. Moreover, the number of wiring patterns 42 disposed between the third and fourth wiring patterns 23 and 24 is increased, thereby making it possible to increase degree of freedom of wiring.

Figure 7:
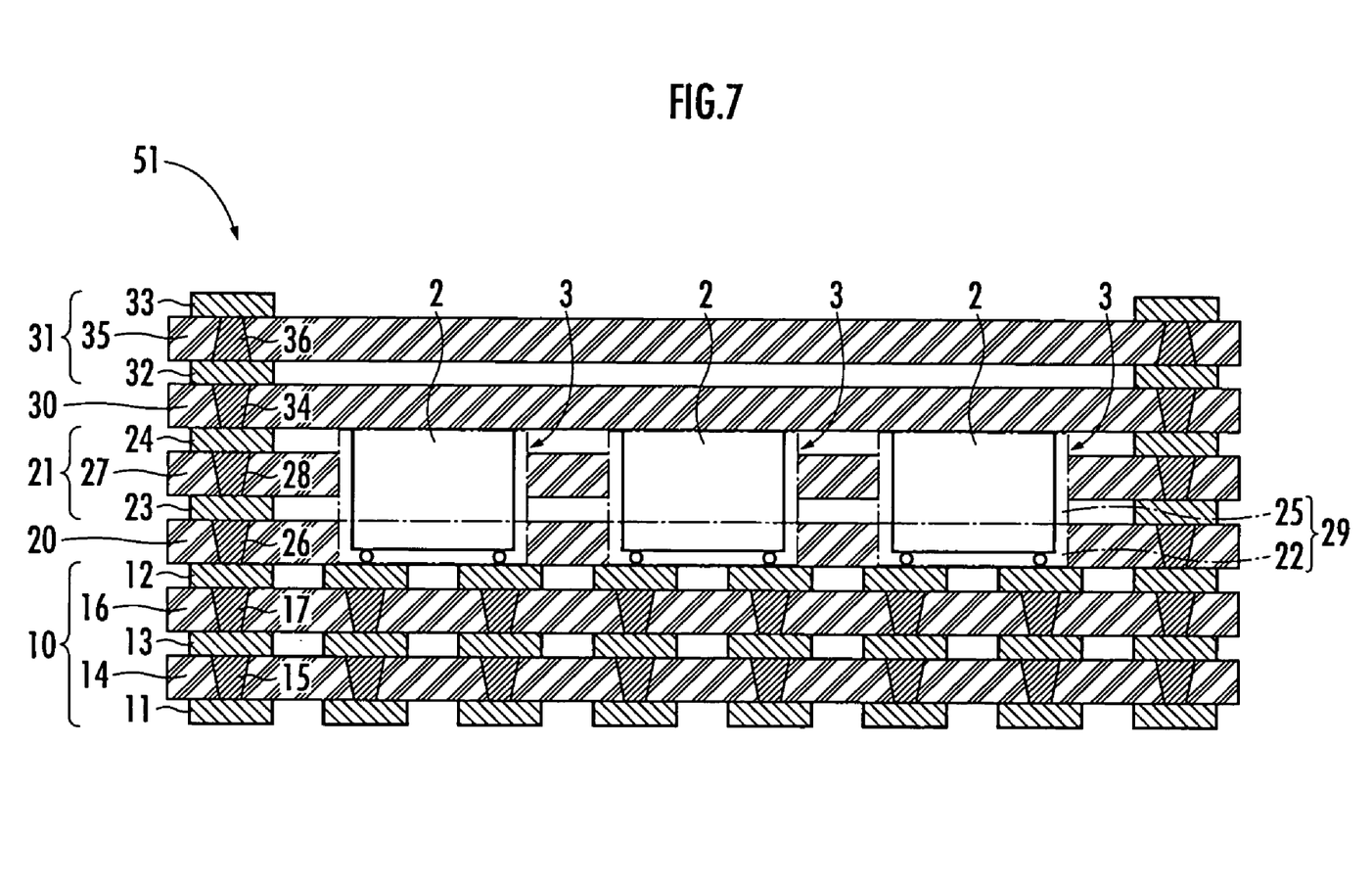
FIG. 7 is an explanatory cross sectional view showing a further configuration example of multilayer printed wiring board housing semiconductor element therewithin of the embodiment.
Figure 8:
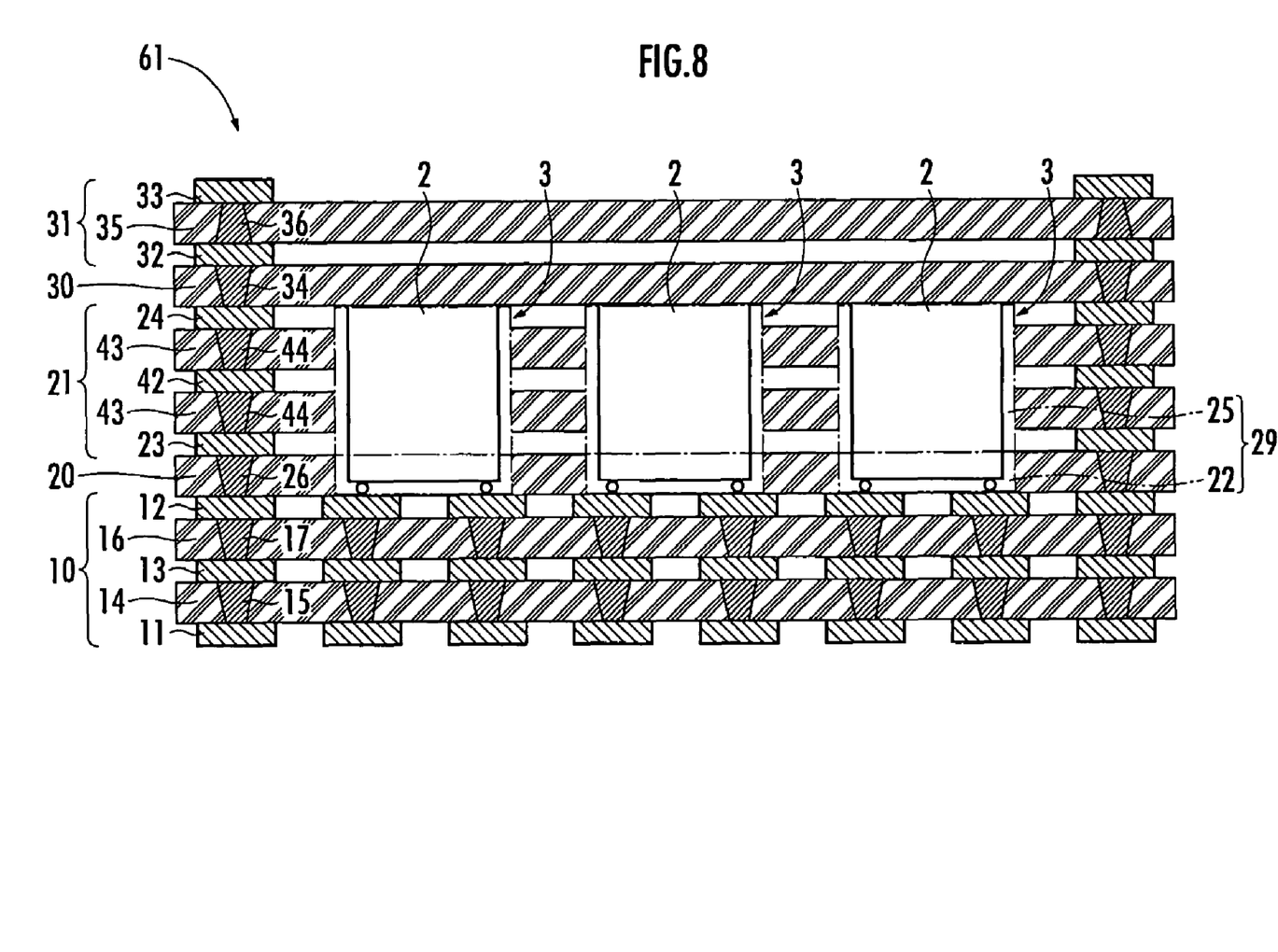
FIG. 8 is an explanatory cross sectional view showing a modified further configuration example of multilayer wiring board housing semiconductor element therewithin of the embodiment.

Further, the multilayer printed wiring board of the present invention may be also caused to be of the configuration in which plural semiconductor elements 3 are housed therewithin in the state mounted on the second wiring pattern as in the case of a multilayer printed wiring board 51 shown in FIG. 7 and a multilayer printed wiring board 61 shown in FIG. 8.

The multilayer printed wiring boards 51, 61 of the embodiment will be explained with reference to FIGS. 7 and 8. The multilayer printed wiring boards 51, 61 are the same configuration as the multilayer printed wiring board 1 shown in FIG. 1 or the multilayer printed wiring board 41 shown in FIG. 6 except for the number of semiconductor elements 3 housed therewithin in the state mounted on the second wiring pattern 12.

In the multilayer printed wiring boards 51, 61, three semiconductor elements 2 are mounted on the second wiring pattern 12. Moreover, the multilayer printed wiring boards 51, 61 includes three space regions 3 penetrating through the first insulating layer 20 and the second printed wiring board 21 in the thickness direction for accommodating semiconductor elements 3 therewithin.

While, in the multilayer printed wiring boards 51, 61, three semiconductor elements 2 are housed in the state mounted on the second wiring pattern, the number of semiconductor elements 3 included in the state mounted may be two, or four or more.

It should be noted that illustration is made in the multilayer printed wiring boards 51 and 61 shown in FIGS. 7 and 8 such that three semiconductor elements 3 are mounted on the same straight line of the second wiring pattern 12 for convenience of explanation, but the present invention is not limited to such implementation.

What is claimed is:

1. A multilayer printed wiring board including: a first printed wiring board including: at least two wiring patterns of a first wiring pattern formed on one side thereof, and a second wiring pattern formed on an opposite side thereof, and such that the first and second wiring patterns are electrically conducted to each other; and a semiconductor element housed within the first printed wiring board in the state mounted on the second wiring layer, the multilayer printed wiring board comprising: a second printed wiring board laminated on the second wiring pattern through a first insulating layer; a third printed wiring board laminated on the second printed wiring board through a second insulating layer; and a space region penetrating through the first insulating layer and the second printed wiring board in a thickness direction thereof, and adapted so that the semiconductor element can be accommodated therewithin, wherein the second printed wiring board includes: a third wiring pattern formed on a plane surface opposite to the first insulating layer; a fourth wiring pattern formed on a plane surface opposite to the second insulating layer; a first bump disposed on the third wiring pattern, and penetrating through the first insulating layer in a thickness direction thereof; at least one insulating layer disposed between the third and fourth wiring patterns; and a second bump penetrating through the insulating layer in the thickness direction thereof, and the third wiring pattern and the second wiring pattern being electrically conducted to each other through the first bump;

wherein the third wiring pattern and the fourth wiring pattern being electrically conducted to each other through the second bump, the third printed wiring board includes: a fifth wiring pattern formed on a plane surface opposite to the second insulating layer; a sixth wiring pattern formed on a plane surface opposite to the last-mentioned plane surface; a third bump disposed on the fifth wiring pattern and penetrating through the second insulating layer in the thickness direction thereof; and a fourth bump penetrating through the inside of the third printed wiring board in the thickness direction thereof, the fifth wiring pattern and the fourth wiring pattern being electrically conducted to each other through the third bump, the fifth wiring pattern and the sixth wiring pattern being electrically conducted to each other through the fourth bump, the first insulating layer and the insulating layer disposed between the third wiring pattern and the fourth wiring pattern each having a thickness ranging from 10 μm to 100 μm, and the first bump and the second bump each having a diameter of the maximum bottom surface ranging from 50 μm to 200 μm.

2. The multilayer printed wiring board according to claim 1, wherein the second printed wiring board includes a plurality of the insulating layers disposed between the third wiring pattern and the fourth wiring pattern, and includes a wiring pattern or patterns disposed between the insulating layers.

3. The multilayer printed wiring board according to claim 1,
wherein the first insulating layer and the insulating layer disposed between the third wiring pattern and the fourth wiring pattern each have a thickness of 60 μm, and
the first bump and the second bump each have a diameter of the maximum bottom surface of 150 μm.

4. The multilayer printed wiring board according to claim 1,
wherein one or a plurality of the semiconductor elements is housed therewithin in the state mounted on the second wiring pattern, and the space region or regions of which number is the same as that of the semiconductor elements is provided.

5. The multilayer printed wiring board according to claim 4,
wherein three semiconductor elements are housed therewithin in the state mounted on the second wiring pattern.

6. The multilayer printed wiring board according to claim 1,
wherein each of the respective wiring patterns is made of metallic foil.

7. The multilayer printed wiring board according to claim 6,
wherein the metallic foil is copper foil.

8. The multilayer printed wiring board according to claim 1,
wherein each of the respective insulating layers is prepreg layer.

9. The multilayer printed wiring board according to claim 8,
wherein the prepreg layer contains one or more kinds of resins selected from the group consisting of epoxy resin, bismaleimide triazine resin, polyimide resin, polyether resin, phenol resin, polyether.ether.ketone resin and liquid crystal polymer.

10. The multilayer printed wiring board according to claim 1,
wherein each of the respective bumps is formed by laminating metallic mask having a penetration hole on the wiring pattern where the bumps are formed, screen-printing conductive paste including conductive powder on the metallic mask, molding individual conductive pastes which have been pressed into the penetration hole by such screen-print process into conical shapes, and drying the paste.

11. The multilayer printed wiring board according to claim 10,
wherein the conductive powder is silver.

12. The multilayer printed wiring board according to claim 1,
wherein the space region is formed by any one of methods of a method of punching the first insulating layer and the second printed wiring board therethrough in a thickness direction thereof by punch, a method of boring the same by drill, and a method of cutting the same by cutter.

* * * * *